United States Patent [19]

Johnston

[11] Patent Number: 5,256,474
[45] Date of Patent: Oct. 26, 1993

[54] METHOD OF AND APPARATUS FOR MANUFACTURING PRINTED CIRCUIT BOARDS

[76] Inventor: James A. Johnston, 29 Castle Hill Rd., Windham, N.H. 03087

[21] Appl. No.: 435,769

[22] Filed: Nov. 13, 1989

Related U.S. Application Data

[63] Continuation of Ser. No. 202,091, Aug. 25, 1988, abandoned, which is a continuation of Ser. No. 929,753, Nov. 13, 1986, abandoned.

[51] Int. Cl.$^5$ ............................................. B32B 15/08
[52] U.S. Cl. ................................... 428/220; 428/450; 428/461
[58] Field of Search ............... 428/352, 457, 461, 901, 428/450, 220

[56] References Cited

U.S. PATENT DOCUMENTS

| | | | |
|---|---|---|---|
| 4,357,395 | 11/1982 | Lifshin et al. | 428/607 |
| 4,455,181 | 6/1984 | Lifshin et al. | 156/150 |
| 4,532,096 | 7/1985 | Bogner et al. | 264/109 |
| 4,547,544 | 10/1985 | Allardice | 525/478 |
| 4,690,845 | 9/1987 | Kloss, Jr. | 428/40 |

*Primary Examiner*—Jenna L. Davis
*Attorney, Agent, or Firm*—Hamilton, Brook, Smith & Reynolds

[57] ABSTRACT

There is disclosed a dual purpose separator-release plate (30) for the use in the lamination and drilling of printed circuit boards, comprising a substrate sheet of aluminum foil (32), covered on both sides with release material (34), the plates being placed in engagement with the foil surfaces (6) and (8) of a PC board prior to curing the epoxy layer (4), after curing, retaining the separator-release plates in engagement with the PC board, and which plates serve as drill entry and drill backup material.

10 Claims, 3 Drawing Sheets

METHOD OF AND APPARATUS FOR MANUFACTURING PRINTED CIRCUIT BOARDS

This is a continuation of co-pending application Ser. No. 07/202,091 filed on Aug. 25, 1988, which is a continuation of 06/929,753, filed Nov. 13, 1986, both now abandoned.

FIELD OF THE INVENTION

This invention relates to printed circuit boards, in general and more particularly, to a method and apparatus for making them.

BACKGROUND OF THE INVENTION

One common form of printed circuit board employs a dielectric epoxy resin-impregnated woven glass fiber sheet, commonly known as "prepreg", to the opposite sides of which are bonded conductive copper foil. This lamination is often called a core, or board. The copper, through various photographic processes, is etched to produce conductive paths. A common technique in the manufacturing process is to assemble a stack of boards, one on top of another, in a press lay-up. The stack is called a "book". The entire book is subjected to heat and pressure in a press, and thereafter, the individual boards are separated for further processing.

One of the subsequent processing steps is drilling holes in the board for the acceptance of conductor leads of electronic components. Drill entry and drill backup material is placed adjacent the copper layers, preparatory to drilling, to assure clean holes without burrs, etc.

One of the problems encountered in the processing cycle is caused by each of the materials having a different thermal coefficient of expansion. For example, the woven glass fabric portion of the prepreg normally has a low thermal coefficient and the epoxy portion has a high coefficient. The copper foil in the board surfaces also has a high thermal coefficient. However, since the finished boards are symmetrical, the stresses are balanced. Nevertheless, during the processing, stress and adhesion tendency are encountered.

The copper surfaces of the boards are normally separated one from another by stainless steel sheets called separator or plainishing plates. They engage the copper during the laminating process to assure that the copper foil will not be indented or scratched. When epoxy adheres to a stainless steel separator plate, it becomes extremely difficult to remove and the costly separator plates must then be cleaned and polished before they can be used again. Should the stainless steel plate bond to the copper of a board, the difference in thermal coefficients will cause warpage.

To avoid any flowing epoxy from adhering to the stainless steel plates or bonding them to the copper, the stainless steel plates are in turn, separated from the copper foil by disposable release sheets.

One conventional technique for fabricating a multi-layer book of printed circuit boards is to form a press lay-up by first laying a heavy metal sheet called a caul blade or caul plate on the press platter. The caul plate supports and mounts tooling pins. Next, clip board is laid on the caul plate. The chip board helps to distribute the heat evenly and to keep any imperfection in the caul blade from being transferred to the copper surfaces of the boards.

A clean, smooth, polished stainless steel separator plate is placed on top of the chip board. Thereafter, tooling pins are inserted into the caul plate, the chip board and separator plate. The tooling pins aid in aligning the copper and prepreg components of each board. A release sheet is next laid over the stainless steel plate. The release sheets sometimes have a tendency to adhere to the copper foil, resulting in wrinkling or staining of the foil.

The next step is to begin the assembly of the boards themselves. A first layer of copper is placed over the tooling pins, on top of the release sheet. A layer of prepreg is placed over the first copper layer and a second copper layer over the prepreg. If desired, an etched and oxide treated inner layer may be laid on top of the first layer of prepreg and to this, another layer of prepreg is added. Finally, the outer layer of copper is placed on top of the prepreg. Sometimes the copper layers are pre-coated or pre-laminated, and in this case, the lamentation is placed copper side up on the prepeg. Another release sheet is laid on top of the copper, another separator plate is cleaned and positioned on top of the release sheet. This constitutes the laminations required for one board. Thus, there are two stainless steel separator plates, one on the bottom, and one on top of the assemblage, and two disposable release sheets between the steel and the copper. The procedure continues until at least four boards are assembled, one on top of another. Sometimes eight or more boards are laid up.

Upon positioning the last separator plate, another layer of chip board is added, with an upper caul plate over the entire stack. The entire assemblage is often referred to as a multi-layer book. It is then sent to the curing press.

The operating temperature and pressure of the press is set, and the press activated. The bonding-curing process takes from about one to two hours, depending upon the manufacturer's individual specifications. When bonding has taken place, and the press cooled down, the multi-layer book is removed, and the individual boards are separated. They are then covered, top and bottom with drill entry and drill back up material, and sent off for drilling.

Before the stainless steel separator plates can be used again, the epoxy must be removed, they must be sanded free of defects and scrubbed clean. The epoxy must be cleaned from the tooling pin holes. Should any scratch or deep depression be found in the separator plates, they must be sent to a machine shop for refinishing or be discarded.

It will be obvious from the foregoing that the process is highly labor intensive, the separator sheets are costly, and large quantities of release sheets are being consumed in each cycle.

It is accordingly, an object of this invention to eliminate the need for costly stainless steel separator plates between boards.

It is another object of the invention to eliminate the need for disposable release sheets.

Yet another object is to eliminate the need for separate drill entry and back up material to be applied to the top and bottom of each board preparatory to drilling.

SUMMARY OF THE INVENTION

The method of this invention resides in the making of laminated printed circuit boards of the type having outer conductive metallic layers and at least one inner dielectric layer containing heat curable resin. The use of stainless steel sheets is eliminated, and their function is replaced by the use of dual purpose separator-release sheets formed of aluminum and coated on both sides with a polymeric resin release material. The dual purpose separator-release sheets also serve the function of drill entry and drill back-up material in the drilling process.

The process of making the laminated printed circuit boards involves assembling a multi-layer book of circuit boards, one on top of another, in a press lay-up. A dual purpose separator-release sheet, made in accordance with this invention, is placed in engagement with each outer metallic layer of the board, and the laid-up book is subjected to heat and pressure to cure the resin. At least one of the cured boards is separated from the book with the separator release sheets remaining in engagement with the outer metallic layers of the separated board. The board is then drilled to form conductor lead holes in the board with the separator-release sheets attached. In this manner, the separator-release sheets serve to prevent the resin from contaminating adjacent boards in the curing process, and also serve as drill entry and drill backup material in the drilling process.

Whereas the above-described method involves the drilling of at least one cured board at a time, a multiplicity of boards may be simultaneously drilled, and this involves placing a second separator-release sheet in engagement with a sheet that separates every second board in the book. The book is then separated into stacks of at least two boards each, with the separator-release sheets in engagement with the outer metallic layers of the stack of two or more boards, which stack is then drilled with the separator release again serving as drill entry and back up material.

The dual purpose separator-release plates for use in the lamination and drilling of the printed circuit boards comprises a substrate sheet of aluminum foil. A layer of release material covers both sides of the substrate sheet. The release material is a polymeric resin, which is thermally stable to at lease 375° C. The substrate sheet of aluminum foil is from approximately 0.005 inches to approximately 0.025 inches in thickness. The release material is a polymeric resin of from approximately 1 to approximately 5 microns in thickness.

The above and other features of the invention, including various novel details of construction and combinations of parts, will now be more particularly described with reference to the accompanying drawings and pointed out in the claims. It will be understood that the particular method and apparatus for manufacturing printed circuit boards embodying the invention is shown by way of illustration only, and not as a limitation of the invention. The principles and features of this invention may be employed in varied and numerous embodiments without departing from the scope of the invention.

DETAILED DESCRIPTION OF THE INVENTION

Figure 1:
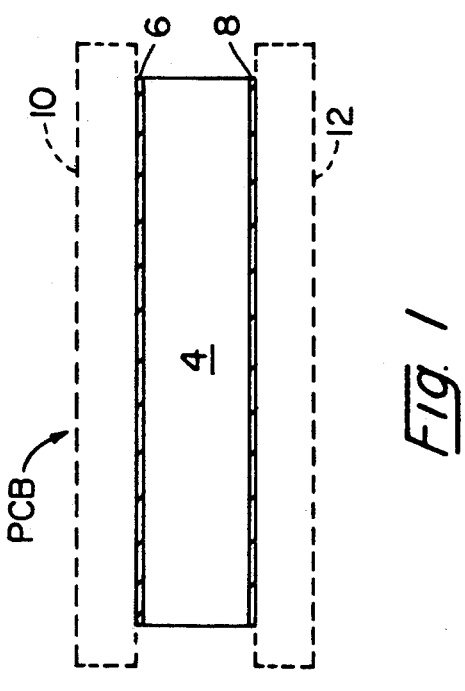
FIG. 1 is a schematic cross section of one common form of a printed circuit board.

FIG. 1 is a schematic cross-sectional representation of a typical printed circuit or PC board, designated PCB in the drawings. It includes a dielectric layer 4 of epoxy resin-impregnated woven glass fiber commonly known as "prepreg". On opposite sides of the prepreg 4 are conductive layers 6 and 8 of relatively thin copper foil, which may be pure copper or pre-lamenated. This assembly is called a board or a core. The copper layers are subsequently etched to produce circuit paths on top of the prepreg inner layer. The boards are drilled in a predetermined pattern to accept the conductive leads of the various electronic components which are mounted on the board and soldered to the conductive copper paths.

During the drilling process, in order to support the board, prevent delamination and produce clean holes, free of burrs, drill entry material and drill backup material is placed in engagement with the copper foil both above and below the board. These are illustrated in FIG. 1 as elements 10 and 12.

Figure 2:
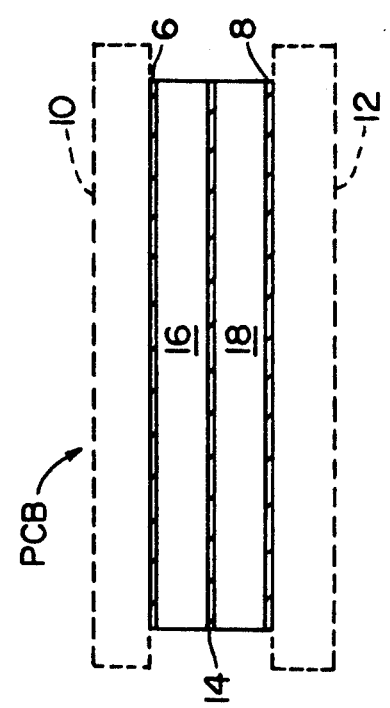
FIG. 2 is a schematic cross section of another common form of a printed circuit board.

FIG. 2 shows another conventional printed circuit board comprising outer copper foil layers 6 and 8, but having a central conductive layer 14 sandwiched between two layers 16 and 18 of prepreg material. While the invention relates to the manufacture of either the FIG. 1 or FIG. 2 type of printed circuit board it is the FIG. 2 or triple-copper-layer board will be shown in describing the invention.

Figure 5:
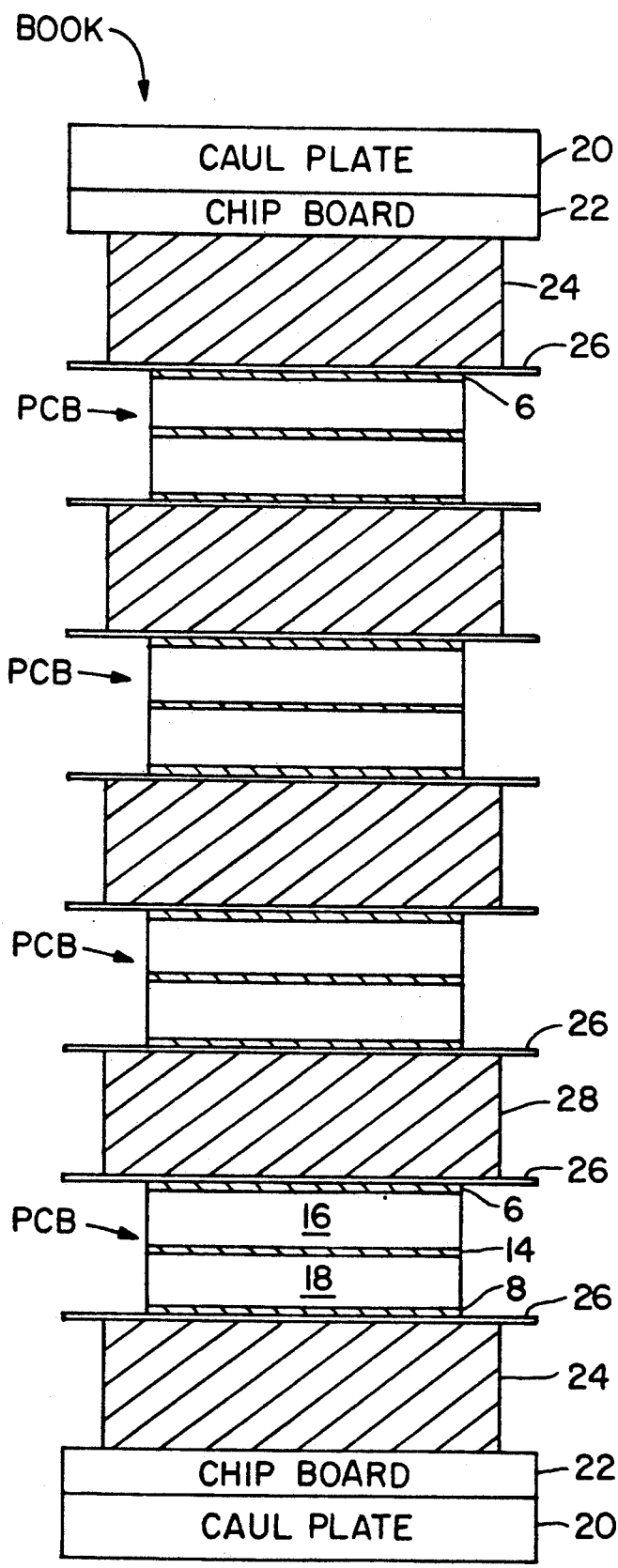
FIG. 5 is a schematic cross section of a conventional press lay-up of a book of printed circuit boards.

A conventional technique for manufacturing printed circuit boards is illustrated schematically in FIG. 5. Preparatory to being sent to the press room for lamination, a plurality of printed circuit boards 2 are assembled, one top of another, in what is called a book. At the bottom of the book is a caul plate 20. The caul plate is a heavy metallic plate, which mounts and supports tooling pins (not shown). On top of the caul plate is placed a sheet of chip board 22 which evenly distributes the heat to the book of boards. Some manufacturers substitute silicon rubber mats for the chip board.

To align the subsequent layers of the book, tooling pins (not shown) are inserted in the caul plate and project through the chip board. In order not to transfer any irregularities in the chip board surface to the thin copper foil layer of the first board in the book, a smooth, polished, stainless steel separator plate 24 is laid on top of the chip board. Its surface is free of nicks and scratches. To prevent the epoxy in the prepreg material in a printed circuit board from adhering to the separator plate 24, the plate is covered with a release sheet 26 which must be sized and punched with clearance holes to fit over the tooling pins. Such sheets are often called release paper. One form of such paper is supercalandered, clay coated, natural kraft paper, which is coated on the clay side with a silicon release coating. One form of such release paper is sold as "Release Paper 8503" from the HP Smith Company which is a subsidiary of Phillips Petroleum Company, Chicago, Ill.

Some manufacturers do not use silicon release paper in order to avoid contaminating the laminated PCBs.

The next step is to assemble the layered components of the first PCB on top of the release sheet 26. The lower copper foil layer 8 is placed on the release sheet. Then a layer of prepreg 18 is placed on the copper. A middle layer or core 14, of copper foil, which itself may be prelaminated, etched and oxide treated, is placed over the tooling pins on top of the prepreg 18. Over this, another layer 16 of prepreg is placed and finally the outer copper layer 6 is placed. The operator then numbers this board in the stack.

Boards of four conductive layers may also be made in this way. This first board is then covered with another release sheet 26, a clean and polished separator sheet 28, and still another release sheet 26. The process is repeated to assemble more PCBs.

It will be appreciated that the release paper sometimes adheres to the copper foil which can cause warpage and/or staining.

Whereas FIG. 5 shows four boards in the book, frequently eight boards are assembled preparatory to the entire book being sent to the press.

On top of the upper copper foil layer 6 of the top PCB is placed a sheet of release paper 26, a cleaned stainless steel separator plate 24, a layer of chip board 22 and an upper caul plate 20.

The book is then sent to the press room where it is placed in the press. The temperature and pressure of the press is set to the manufacturers requirement and the book remains for approximately 1 to 2 hours to cure the epoxy and bond the laminates.

After the PCBs have been laminated, the book is broken down and the separate PCBs removed. The stainless steel separator plates 24 must be cleaned of any epoxy. They must be sanded to free them of any defects and then scrubbed clean. The epoxy must removed from the tooling holes. If any indentations such as scratches or nicks are found in the stainless steel plates, they must be either thrown away or sent to a machine shop for repair. This is not only expensive but the entire process is labor intensive and time consuming. The release sheets 26 are discarded.

Figure 3:
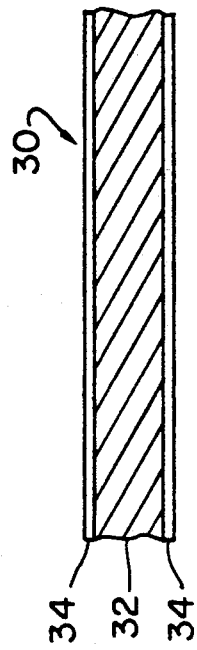
FIG. 3 is a schematic cross section of a dual purpose separator-release plate made in accordance with the present invention.

Applicant has found that most of the costly stainless steel separator plates 24 and the use of the release sheets 26 can be eliminated by the use of a novel dual purpose separator-release plate 30 which is shown in FIG. 3.

The separator-release plate comprises a substrate sheet of aluminum foil 32 covered, on each side, by a layer of release material 34. The substrate sheet of aluminum foil is from about approximately 0.005 inches to approximately 0.025 thick and it has been found that 3003-H19 or 3004-H19 aluminum foil is satisfactory for this purpose. The release material is a polymeric resin initially applied by a spraying process which deposits approximately 0.001 inch of release material on the aluminum substrate 32. In the drying and curing process, solvents in the release material flash off leaving the coating from about approximately 1 to approximately 5 microns thick. The polymeric material may be one of a number of resins which are thermally stable to approximately 375° C. A material found satisfactory for this purpose is sold under the trade name FREKOTE 700 by FREKOTE, Inc., a subsidiary of the Dexter Corporation of Boca Raton, Fla. Freekote 700 is a siloxazane. A siloxazane is a polymeric resin comprising a siloxane backbone polymer with silazane side chains. A siloxazane encompasses both block polymers and alternating polymers.

A new process will now be described with reference to FIG. 6 where the new dual purpose separator-release plates 30, hereinabove described, are substituted for most of the stainless steel separator plates 24 and all of the paper release sheets 26 of the prior process. The dual purpose release plates 30 are also utilized as the drill backup and drill entry material employed in the drilling process.

A book is laid up on a conventional caul plate 20 which is covered by a chip board 22 or a silicon rubber pad. If desired, one stainless steel separator plate 24 may be employed to prevent the transfer of irregularities of the chip board 22 from being transferred to the thin copper foil of the first PC board. The stainless steel plate may be eliminated by the use of a 0.050 inch chip board that helps to distribute the heat evenly.

A dual purpose separator-release plate 30, embodying features of this invention is laid upon the clip board or the stainless steel separator plate (if one is used) without the use of a paper release sheet. The polymeric resin release material 34 on the dual purpose plate engages the stainless steel plate 24 or the clip board directly. The lower copper foil 8 is laid directly upon the upper polymeric resin release surface 34 of the dual purpose separator-release plate and then, in turn, a layer of prepreg 18, the inner layer of copper foil 14 (if one is used), the upper layer 16 of prepreg and finally the outer layer 6 of foil are superposed, one upon another. This completes the first PC board. The middle layer or core 14 of foil could be eliminated if the FIG. 1 type of PC board is desired, or conversely, more than one cores may be employed. Another dual purpose separator-release plate 30 is then placed upon the upper copper foil surface 6 of the first PC board. Thus, the first board has a dual purpose aluminum separator release plate 30 on its bottom and on its top. It will be appreciated that the polymeric surfaces 34 of the seperator-release plates 30 have virtually no tendency to adhere to the copper, thus will not warp or stain it. Furthermore, the plates 30 will not pick up adhered epoxy resin.

Figure 6:
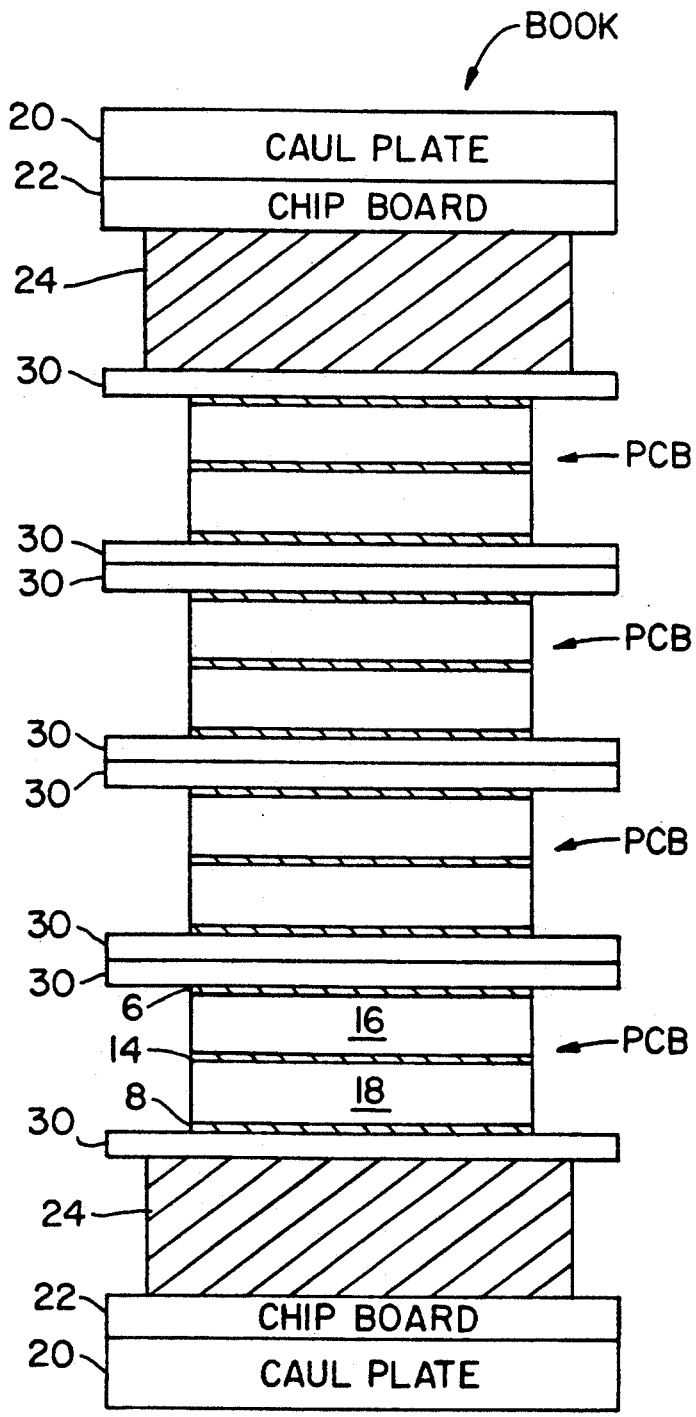
FIG. 6 is a schematic cross-section of a press lay-up of printed circuit boards made in accordance with the method of this invention.

If the printed circuit boards are to be drilled one at a time, a second dual purpose aluminum separator-release plate 30 is placed directly over the plate 30 covering the first book as seen in FIG. 6. Thereupon, another PCB is laid up. On top of the second board is laid another dual purpose aluminum-separator release plate 30, it also being covered by another separator-release plate 30, if desired, and in like manner two more PC boards are assembled. The upper most PC board is overlaid with but a single dual purpose aluminum separator-release plate which, in turn, may be covered by stainless steel plate 24 and/or chip board 22 and the upper caul plate 20. No paper release sheets are employed.

If boards are to be drilled, two or more at a time, or even eight at a time, only a single dual purpose seperator-release sheet 30 is used between PCB's, i.e., one sheet engaging both the upper copper surface of one PCB and the lower copper surface of the PCB.

Only four PC boards have been shown assembled in the book by the new process illustrated in FIG. 6, and by the conventional process shown in FIG. 5. Frequently, however, eight or more boards are assembled. When eight boards are assembled it will be noted that seven expensive stainless steel separator plates 24, and sixteen release sheets 26 may be replaced with nine pieces of Applicant's dual purpose aluminum separator-release plate 30. In addition, in anticipation of drilling boards separately, there is one more dual purpose aluminum separator-release plate 30, placed back to back with a release plate 30 on each book in the stack except for the upper most book and the lower most book. The only requirement is that one dual purpose separator-release sheet 30 be placed in engagement with each copper foil surface of a PC board.

As compared with the FIG. 5 illustration, i.e. of a book having but only four assembled PC boards, by the new process shown in FIG. 6 three costly stainless steel plates 24 have been eliminated and eight sheets of paper release sheets 26 have been totally eliminated and replaced by eight sheets of dual purpose aluminum separator-release plates. Five dual purpose separator-release sheets could have been used.

Figure 4:
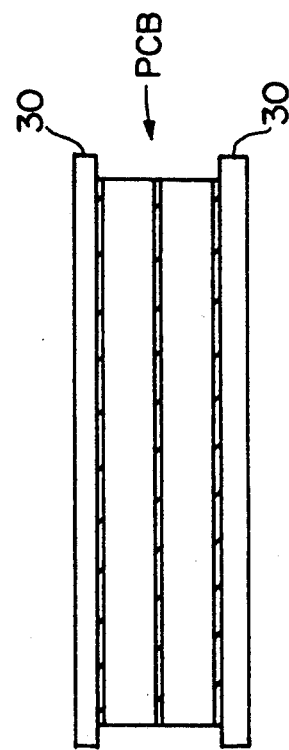
FIG. 4 is a schematic cross section of a printed circuit board of the type shown in FIG. 2 covered, top and bottom with a separator-release plate of the type shown in FIG. 3, preparatory to drilling.

After the book of PCB's has been sent to the press room for laminating and curing, the books are broken down preparatory to drilling. Each PC board, but for the bottom and top boards in the book, were separated by two dual purpose aluminum separator-release plates. Each board, as illustrated in FIG. 4, is now covered top and bottom by a dual purpose aluminum separator-release plate and drilled individually. If, however, the entire book of four boards were to be drilled simultaneously, three seperator-release sheets 30 would be eliminated.

Being coated with the release material 34, after drilling, the sheets or plates 30 are simply lifted off the finished PC boards. The plates 30 have thus served the dual purpose, first replacing the costly stainless steel separator sheets and all of the paper release sheets, and secondly serving as the drill entry and drill backup material.

On occasions, the book may be assembled contemplating drilling two PC boards at a time. In this instance, only one dual purpose separator-release sheet 30 is required between each PC board, with a sheet 30 on top and a sheet 30 on the bottom. Obviously, more than two boards may be drilled at one time and the assembly of the press lay-up prepared accordingly.

I claim:

1. A dual purpose separator-release plate for use initially in the lamination and, subsequently, in drilling of printed circuit boards, comprising:
    a substrate sheet of aluminum foil;
    a layer of release material covering both sides of the substrate sheet, such that both sides may releaseably engage a printed circuit board simultaneously during manufacture; and
    the release material comprising a siloxazane polymer which is thermally stable to at least 375° C.

2. A dual purpose separator-release plate for use initially in the manufacturing and, subsequently, in drilling of printed circuit boards, comprising:
    a substrate sheet of aluminum foil from approximately 0.005 inches to approximately 0.025 inches thick;
    a layer of release material covering both sides of the substrate sheet, such that both sides may releaseably engage a printed circuit board simultaneously during manufacture; and
    the release material being a siloxazane polymer.

3. A dual purpose separator-release plate for use initially in the manufacturing and, subsequently, in drilling of printed circuit board, comprising:
    a substrate sheet of aluminum foil;
    a layer of release material covering both sides of the substrate sheet, such that both sides may releaseably engage a printed circuit board simultaneously during manufacture; and
    the release material being a siloxazane polymer of from approximately 1 to approximately 5 microns thick.

4. A separator-release plate according to claim 1 wherein the substrate is from approximately 0.005 to approximately 0.025 inches thick.

5. A separator-release plate according to claim 3 wherein the substrate is from approximately 0.005 to approximately 0.025 inches thick.

6. A separator-release plate according to claim 1 wherein the layer of siloxazane polymer is from approximately 1 to approximately 5 microns thick.

7. A separator-release plate according to claim 2 wherein the layer of siloxazane polymer is from approximately 1 to approximately 5 microns thick.

8. A separator-release plate according to claim 2 wherein the siloxazane polymer is thermally stable to at least 375° C.

9. A separator-release plate according to claim 3 wherein the siloxazane polymer is thermally stable to at least 375° C.

10. A dual purpose separator-release plate for use initially in the lamination and, subsequently, in the drilling of printed circuit boards, comprising:
    a substrate sheet of aluminum foil from approximately 0.005 inches to approximately 0.025 inches thick;
    a layer of release material from approximately 1 to approximately 5 microns thick covering both sides of the substrate sheet, such that both sides may releaseably engage a printed circuit board simultaneously during manufacture; and
    the release material comprising a siloxazane polymer which is thermally stable to at least 375° C.

* * * * *